US006274881B1

(12) United States Patent
Akiyama et al.

(10) Patent No.: US 6,274,881 B1
(45) Date of Patent: Aug. 14, 2001

(54) ELECTRON EMISSION ELEMENT HAVING SEMICONDUCTOR EMITTER WITH LOCALIZED STATE, FIELD EMISSION TYPE DISPLAY DEVICE USING THE SAME, AND METHOD FOR PRODUCING THE ELEMENT AND THE DEVICE

(75) Inventors: Koji Akiyama, Neyagawa; Hideo Kurokawa, Katano, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/297,210

(22) PCT Filed: Aug. 25, 1998

(86) PCT No.: PCT/JP98/03777

§ 371 Date: Jun. 17, 1999

§ 102(e) Date: Jun. 17, 1999

(87) PCT Pub. No.: WO99/10908

PCT Pub. Date: Mar. 4, 1999

(30) Foreign Application Priority Data

Jan. 10, 1997 (JP) .................................................. 9-268477
Aug. 27, 1997 (JP) .................................................. 9-230592

(51) Int. Cl.[7] ............................ H01L 29/06; H01J 1/304; H01J 9/02; H01J 31/12

(52) U.S. Cl. ............................ 257/10; 313/310; 313/309; 313/336; 313/351; 438/20; 445/49; 445/50; 445/51

(58) Field of Search .............................. 257/10; 313/309, 313/310, 336, 351; 438/20; 445/49, 50, 51

(56) References Cited

U.S. PATENT DOCUMENTS 5,713,775 * 2/1998 Geis et al. ............................ 445/35
5,726,524 * 3/1998 Debe .................................... 313/309
5,729,094 * 3/1998 Geis et al. ........................ 315/169.1
5,990,605 * 11/1999 Yoshikawa et al. ................ 313/310
6,023,124 * 2/2000 Chuman et al. ..................... 313/310
6,184,612 * 2/2001 Negishi et al. ...................... 313/310

FOREIGN PATENT DOCUMENTS 0 798 761 10/1997 (EP) .
0 874 384 10/1998 (EP) .

OTHER PUBLICATIONS

European Search Report dated Dec. 2, 1999 for EP 98 93 8988.

* cited by examiner

*Primary Examiner*—Eddie C. Lee
*Assistant Examiner*—Bradley Wm. Baumeister
(74) *Attorney, Agent, or Firm*—Ratner & Prestia

(57) ABSTRACT

In an electron emission element having an emitter section for emitting electrons, the emitter section includes, on a first conductive electrode, a structure in which at least a first semiconductor layer, a second semiconductor layer, an insulating layer and a second conductive electrode are deposited sequentially; and the first and second semiconductor layers include at least one of carbon, silicon and germanium as a main component, and the first semiconductor layer includes at least one type of atoms among carbon atom, oxygen atoms and nitrogen atoms which is different from the main component.

22 Claims, 7 Drawing Sheets

2000

4000

ELECTRON EMISSION ELEMENT HAVING SEMICONDUCTOR EMITTER WITH LOCALIZED STATE, FIELD EMISSION TYPE DISPLAY DEVICE USING THE SAME, AND METHOD FOR PRODUCING THE ELEMENT AND THE DEVICE

This application is a U.S. National Phase Application of PCT International Application PCT/JP98/03777.

TECHNICAL FIELD

The present invention relates to an electron emission element having a high electron emission characteristic, a high surface stability and a long life used in, for example, a field emission type display device and an imaging tube; and a method for producing such an electron emission element. The present invention further relates to a field emission type display device configured using the electron emission element and a method for producing the same.

BACKGROUND ART

Liquid crystal display panels are in the widest use today as thin and lightweight display devices. A liquid crystal display panel is a light valve for controlling the voltage applied to a liquid crystal layer by a switching element such as a thin film transistor or an MIM (metal-insulator-metal) element on a pixel-by-pixel basis and thus adjusting the amount of light transmitted through the liquid crystal layer. The liquid crystal display devices are not self-light emission elements which emit light themselves and thus generally have problems of dark images and narrow viewing angles.

As a thin and lightweight self-light emission element solving such problems of the liquid crystal display devices, an electron &mission element has been a target of attention. The electron emission element is not a hot-electron emission type element for heating a cathode to emit electrons as a conventional CRT, but is a cold cathode type element for extracting electrons from the cathode by electric field.

Regarding the conventional electron emission elements, for example, a technology for producing a micrometer-size fine vacuum element utilizing a microscopic processing technology used for producing semiconductor transistors and the like (see, for example, (1) Junji ITO, Oyo Buturi, Vol. 59, No. 2, pp. 164–169, 1990, or (2) Kuniyoshi YOKOO, Journal of the Institute of Electrical Engineers of Japan, Vol. 112, No. 4, 1992) has been developed.

As shown in FIG. 7, this electron emission element includes a conductive silicon substrate (cathode substrate) 701 and a silicon layer provided on the silicon substrate 701 and having a conical projection 702 on a surface thereof. The conical projection 702 is formed using microscopic processing technology and acts as an electron emitter section formed of silicon. An anode substrate is provided opposed to the cathode substrate 701 having the electron emitter section. The anode substrate is formed by sequentially depositing a transparent electrode 704 and a phosphor thin film 705, and optionally a metal thin film, on a transparent glass substrate 703. The anode substrate is set up so that a surface thereof having the phosphor thin film 705 faces the electron emitter section.

When the cathode substrate and the anode substrate which are included in a light emission element and are opposed to each other are put in a high vacuum and a prescribed voltage is applied between the cathode substrate and the anode substrate, electrons are emitted from the tip of the electron emitter section into the vacuum. The emitted electrons are accelerated by the applied voltage and reach the phosphor thin film 705. The collision of the electrons with the phosphor thin film 705 causes the phosphor thin film 705 to emit light. The phosohor thin film 703 is allowed to emit light of the three primary colors of red, blue and green or intermediate colors therebetween by changing the materials thereof. The brightness of the light emitted by the phosphor material is controlled by adjusting the voltage a gate electrode 706.

A display device is formed by arranging a plurality of such light emission elements on a plane.

In the case of the above-described conventional electron emission element, the electron emitter section is formed to be conical so that the field intensity of the tip thereof is increased for emitting electrons under low-voltage operation. Accordingly, the current density at the tip is increased.

In addition, since the electron emitter section is formed of silicon which has a lower conductivity than metal, heat is easily generated at the tip during the operation of the element. Accordingly, the tip of the emitter section is vaporized or melted by heat, which increases the radius of curvature of the tip of the emitter section. As a result the electron emission characteristics are deteriorated.

When the electron emission characteristics are thus deteriorated, the brightness of light emitted from the phosphor is lowered. In order to raise the brightness, the operating voltage needs to be raised to recover the, current following though the emitter section. However, since the electric resistance is large at the tip of the emitter section as described above, the amount of heat generated at this section is further increased. Consequently, the electron emission characteristics are acceleratively deteriorated. As a result, the element is destroyed and the desired electron emission is not realized.

As described above, the conventional electron emission element does not allow the operating current to be increased due to the sharp tip configuration of the emitter section, and therefore provides a low brightness of light and a short life, and is inferior in operating stability and reliability. It in very difficult to put such an element into practical use as a display device.

DISCLOSURE OF THE INVENTION

The present invention for solving the above-described problems has objectives of (1) providing an electron emission element which has a sufficiently large operating current and show& no deterioration of an emitter section, with a long life, and is superior in operating stability and reliability; (2) providing at method for producing such an electron emission element; and (3) providing a field emission type display device utilizing such an electron emission element and a method f or producing the same.

According to one aspect of the present invention, in an electron emission element having an emitter section for emitting electrons, the emitter section includes, on a first conductive electrode, a structure in which at least a first semiconductor layer, a second semiconductor layer, an insulating layer and a second conductive electrode are deposited sequentially, and the first and second semiconductor layers include at least one of carbon, silicon and germanium as a main component, and the first semiconductor layer includes at least one type of atoms among carbon atom, oxygen atoms and nitrogen atoms which is different from the main component, whereby the aforementioned objectives can be achieved.

The first semiconductor layer may be amorphous.

Preferably, the first semiconductor layer has an unpaired electron density of about $1\times10^{18}cm^{-3}$ or more.

The insulating layer may include at least one of carbon, silicon and germanium as a main component.

In one example, the second semiconductor layer and the insulating layer interpose therebetween a graded area where an element forming the second semiconductor layer and an element forming the insulating layer exist in a mixed state.

Preferably, the graded area has a thickness which is about 0.01 μm or more and less than the thickness of the insulating layer.

In one example, at least an interface between the second semiconductor layer and the insulating layer has irregularities.

Preferably, the irregularities at the interface has a maximum depth which is about 1/100 or more of the thickness of the insulating layer and less than the thickness of the insulating layer.

In one example, an interface between the first conductive electrode and the first semiconductor layer has irregularities.

In one example, the second semiconductor layer includes at is least microcrystals.

The first and second semiconductor layers may include at least hydrogen.

The second semiconductor layer may include therein an amorphous area and a microcrystalline area in a mixed state.

Preferably, the microcrystals included in the second semiconductor layer hag d diameter of about 1 nm to about 500 nm.

A field emission type display device provided in accordance with the present invention includes an electron emission element having features as set forth above and is configured so that a surface of the second conductive electrode of the electron emission element functions as an electron emission source of the display device, whereby the aforementioned objectives can be achieved.

A method for producing an electron emission element of the present invention includes the steps of: forming a first conductive electrode; bringing halogen ions or halogen radicals into contact with a surface of the first conductive electrode, thereby forming irregularities; and sequentially forming a first semiconductor layer, a second semiconductor layer, an insulating layer, and a second conductive electrode on the surface of the first conductive electrode, whereby the aforementioned objectives can be achieved.

Another method for producing an electron emission element of the present invention includes the steps of: forming a first conductive electrode, decomposing a mixture gas by glow discharge, the mixture gas being obtained by diluting gas containing silicon atoms with a ten fold or more volume ratio of hydrogen gas, thereby sequentially forming a first semiconductor layer and a second semiconductor layer on a surface of the first conductive electrode; and sequentially forming an insulating layer and a second conductive electrode on a surface of the second semiconductor layer, whereby the aforementioned objectives can be achieved.

Still another method for producing an electron emission element of the present invention includes the steps of: sequentially forming a first conductive electrode, a first semiconductor layer, and a second semiconductor layer; bringing halogen ions or halogen radicals into contact with a surface of the first semiconductor layer or the second semiconductor layer, thereby forming irregularities: and sequentially forming an insulating layer and a second conductive electrode on the surface of the second semiconductor layer, whereby the aforementioned objectives can be achieved.

Still another method for producing an electron emission element of the present invention includes the steps of: sequentially forming a first conductive electrode, a first semiconductor layer, and a second semiconductor layer, heating the first and second semiconductor layers, thereby growing microcrystals at least in the second semiconductor layer; and sequentially forming an insulating layer and a second conductive electrode on a surface of the second semiconductor layer, whereby the aforementioned objectives can be achieved.

A method for producing a field emission type display device, provided in accordance with the present invention, includes the steps of: producing an electron emission element according to a fabricating method of the electron emission element having the features as set forth above; forming an anode substrate having a phosphor layer as a top surface; and arranging a surface of the second conductive electrode of the electron emission element and the phosphor layer of the anode substrate to be opposed to each other, thereby causing the surface of the second conductive electrode to function as an electron emission source to the phosphor layer, whereby the aforementioned objectives can be achieved,

BEST MODE FOR CARRYING OUT THE INVENTION

Hereinafter, the present invention will be described by way of several examples with reference to the accompanying drawings,

EXAMPLE 1

Figure 1:
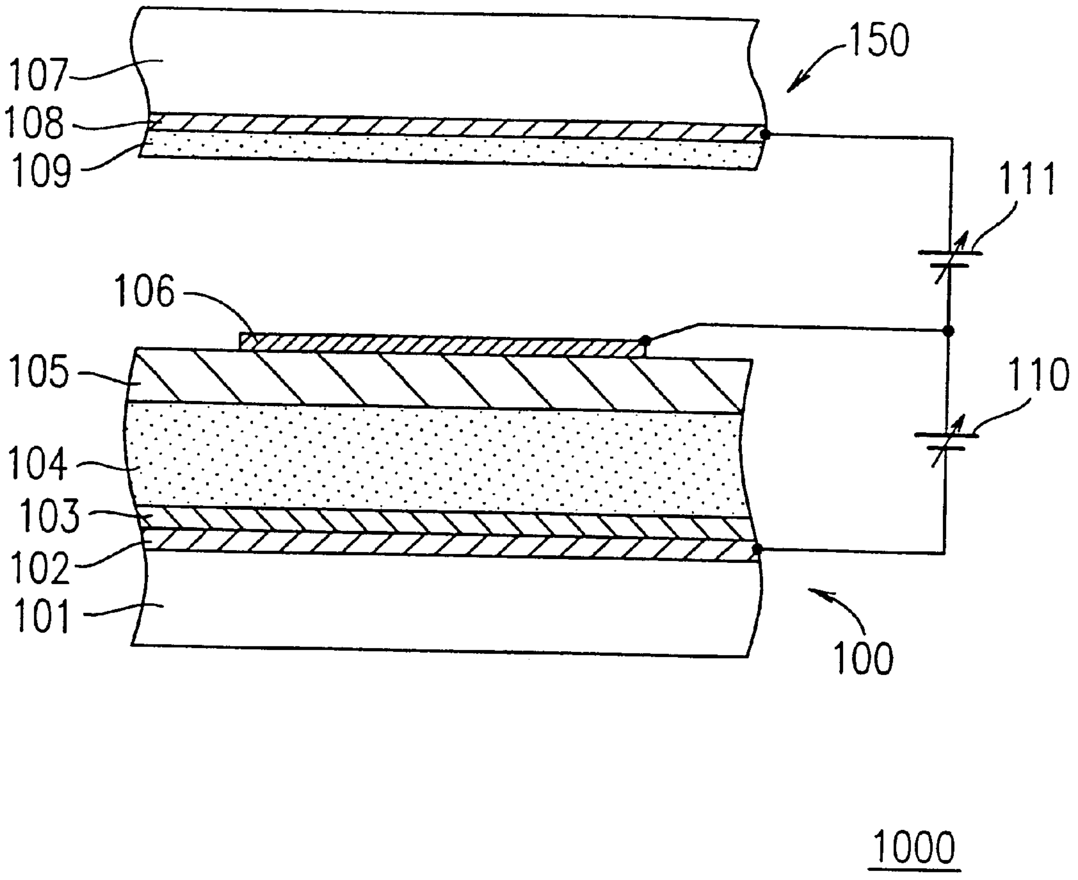
FIG. 1 is a schematic view showing a structure of an electron emission element in one example according to the present invention, and a structure of a field emission type display device configured using the same.

FIG. 1 is a schematic structural view of an electron emission element 100 in a first example according to the present invention and a field emission type display device 1000 using the same, Hereinafter, the structures and production methods of the electron emission element 100 and the field emission type display device 1000 will be described with reference to FIG. 1.

First, a thin film of Al, Al-Li Alloy, Mg, Mg-Ag alloy, Ag, Cr, W, Mo, Ta or Ti is formed as a first conductive electrode 102 on a glass substrate 101 by sputtering or vacuum evaporation to a thickness of about 0.01 μm to about 100 μm, typically about 0.05 μm to about 1 μm.

Next, the substrate 101 is put inside a sputtering apparatus using a Si target. A mixture gas of noble gas such as He, Ne, Ar or Kr, and gas containing oxygen atoms in molecules thereof, such as $O_2$, $O_3$, $N_2O$, NO, $NO_2$, O, $O_2$ or the like is, introduced into the sputtering apparatus. At this point, the pressure in the apparatus is adjusted to about 1 mTorr to about 10 mTorr, typically about 2 mTorr to about 5 mTorr. Then, a radio frequency power (13.56 MHZ) is applied to form an amorphous silicon layer containing oxygen on the first conductive electrode 102 to a thickness of about 1 nm to about 100 nm, typically about 5 nm to about 50 nm. Thus, a first semiconductor layer 103 is formed. The oxygen content in the layer 103 is about 0.0001% by atom to about 10% by atom, typically about 0.001% by atom to about 1% by atom.

Next, an amorphous silicon layer is formed to a thickness of about 1 μm to about 10 μm, typically about 2 μm to about 6 μm using only the noble gas in the same sputtering apparatus, Thus, a second semiconductor layer 104 is formed. The substrate is heated to a temperature of about 300° C. to about 400° C., typically about 350° C. when forming the first and second semiconductor layers 103 and 104.

Sequentially, the gas containing oxygen atoms in molecules thereof is introduced to the same sputtering apparatus in addition to the noble gas, thereby forming an $SiO_x$ layer (where x is 0.25 or more but 2 or less) to a thickness of about 0.4 μm as an insulating layer 105 . Then, as a second conductive electrode 106, a metal thin film having a work function larger than that Of the material of the first conductive electrode 102 (e.g., Au, Pt, Ni or Pd) is formed by sputtering or vacuum evaporation to a thickness of about 1 nm to about 50 nm, typically about 5 nm to about 20 nm.

In this manner, the electron emission element 100 is formed.

The electron emission element 100 is used as a cathode. An anode substrate 150 including a transparent electrode 108 formed of ITO, $SnO_2$, or the like and a phosphor thin film 109 deposited on a glass substrate 107 are located opposed to the cathode. Thus, the field emission type display device 1000 is formed.

The space between the electron emission element (cathode) 100 and the anode substrate (anode) 150 is placed under a vacuum, and a bias voltage in applied between the cathode 100 and the anode 150 using a DC power supplies 110 and 111. As a result, under the biasing conditions that the voltage of the DC power supply 110 is about 10 V to about 200 V and the voltage of the DC power supply 111 is about 3 kV to about 10 kV, electrons were observed to be emitted into the vacuum from the surface of the second conductive electrode 106 and accelerated by the electric field generated by the DC power supply 111 to collide with the phosphor thin film 109, thereby causing the phosphor thin film 109 to emit light.

The electron emission efficiency ratio of the current flowing through the DC power supply 111 with respect to the current flowing through the DC power supply 110 of the element was as high as about 4% to about 32%. The density of the current following between the second conductive electrode 106 and the phosphor thin film 109 exceeded about 1 mA/cm$^2$. Thus, the element was confirmed to have a large operating currant.

Figure 7:
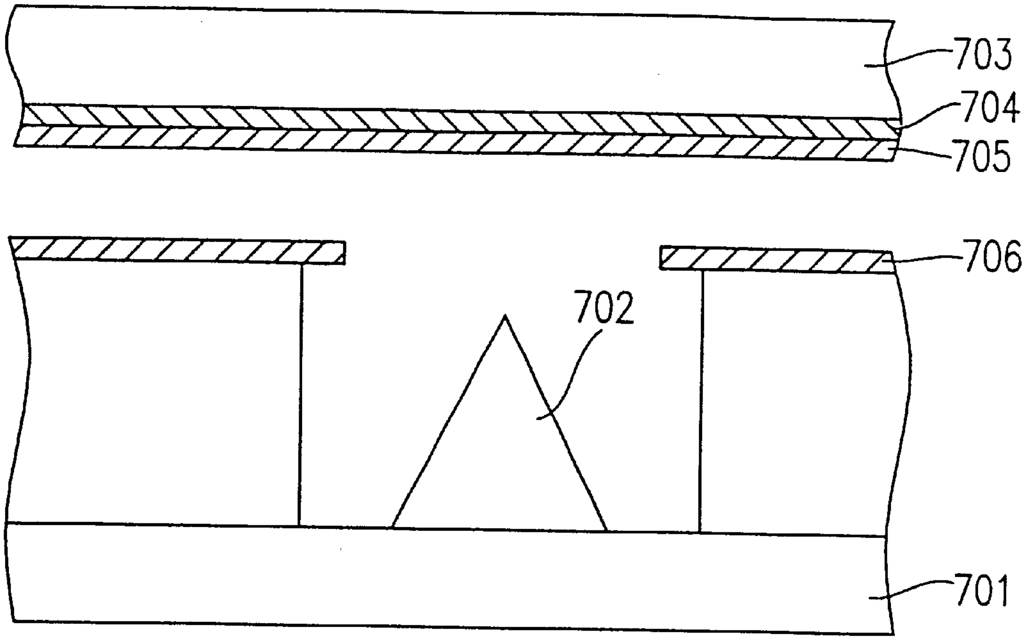
FIG. 7 PRIOR ART
FIG. 7 is a schematic view showing a structure of a conventional electron emission element.

The brightness of the light emitted by the phosphor thin film 109 was higher than the brightness of the conventional structure shown In FIG. 7 by two to three digits. Even after a continuous operation for 1000 hours or more, the electron emission efficiency of the electron emission element 100 did not substantially change. Thus, the electron emission element 100 in FIG. 1 was confirmed to have a long life and to be superior in operating stability.

The reasons why the electron emission element 100 has a high electron emission efficiency, and a larger operating current compared to that of the conventional element, which realizes a high brightness, were studied. As a result, the oxygen content of the first semiconductor layer 103 was found to be relevant. This will be explained below.

First, a comparative electron emission element was produced under the same conditions as the electron emission element 100 except that, unlike the first semiconductor layer 103 of the electron emission element 100, a first semiconductor layer was formed of an amorphous silicon containing no oxygen using only noble gas in lieu of a mixture gas containing oxygen atoms. An examination of the electron emission characteristics of the comparative electron emission element showed substantially no current flowing through the element even when the voltage of the DC power supply 110 was 400 V or more. No electron emission was observed, either.

In order to learn the reason for such significantly different electron emission characteristics between the two elements, in which the properties of the first semiconductor layers are different, the first semiconductor layer 103 of the element 100 in this example was formed on a single crystalline Si wafer and analyzed by an electron spin resonance (SSR) method. It has found that the density of the electron spin (also referred to as "unpaired electron or dangling bond") of the first semiconductor layer 103 is in the range of about $1\times10^{18}$ cm$^{-3}$ to about $5\times10^{19}$cm$^{-3}$ and that the electron spin density increases as the oxygen content increases in the range of the oxygen content of about 0.0001% by atom to about 10% by atom. It was also confirmed that as the electron spin density is higher, the electron emission efficiency is higher.

As a result of similarly analyzing the first semiconductor layer of the comparative element, it was found that the electron spin density thereof is smaller than about $1\times10^{18}$ cm$^{-3}$.

From these results, it is considered that the electron emission element 100 in this example shows the above-described high electron emission efficiency due to the high electron spin density of the first semiconductor layer 103. Since the electron spin generates localized states inside the forbidden band, the density of localized states is increased as the electron spin density is increased. Generally in the case where the electrons are injected into the first semiconductor layer 103 from the first conductive electrode 102, the injection efficiency is low due to the existence of an energy barrier generated by the difference in the Fermi level. However, In the case where a great number of localized states are generated in the first semiconductor layer 103, the electrons in the first conductive electrode 102 are injected from the Fermi level of the first conductive electrode 102 to the first semiconductor layer 103 through the localized states. Accordingly, there is no energy barrier, which remarkably raises the injection efficiency. The injected electrons move in the first semiconductor layer 103 while hopping-conducting from one localized state to another localized state. At the same time, the injected electrons are gradually excited thermally and reach the conduction band. The electrons which have reached the conduction band are injected into the second semiconductor layer 104, mainly formed of the same material as the first semiconductor layer 103, with no barrier, The insulating layer 105 generally includes a great number of localized states. Therefore, the electrons which have moved in the second semiconductor layer 104 move to the localized states in the insulating layer 105, which has a substantially equal energy level as that of the second semiconductor layer 104, without any barrier caused at the interface between the second semiconductor layer 104 and the insulating layer 105.

Furthermore, the voltage of the DC power supply 110 is mostly applied to the insulating layer 105. Accordingly, the electrons existing at the localized states in the insulating layer 105, when being thermally excited to the conduction band, are accelerated by this high electric field to become hot electrons, and emitted into the vacuum through the second conductive electrode 106 which is thin. The electrons which have been emitted into the vacuum collide with the phosphor thin layer 109 by an electric field generated by the DC power supply 111 and thus causes the phosphor thin layer 109 to emit light. Accordingly, an increase in the number of electrons injected into the insulating layer 105 directly leads to an increase in the brightness of the light emitted by the phosphor thin layer 109.

In the case of the comparative element having the first semiconductor layer formed of amorphous silicon containing no oxygen and having a small electron spin density, the amount of the current flowing through the element is small and the electron emission does not occur conceivably because electrons are not injected to the first semiconductor layer through the localized states. In other words, it is considered that one of the keys to the highly efficient electron emission is an increase in the injection efficiency of the electrons from the first conductive electrode 102 to the first semiconductor layer 103.

When the oxygen content of the first semiconductor layer 103 is more than 10% by atom, the electron emission efficiency decreases. As the oxygen content is increased, the electron spin density is drastically decreased. Generally, an amorphous silicon layer is used in the state where the dangling bond therein is intentionally terminated by a hydrogen atom. In the case where the oxygen content is high as above, the oxygen atom is considered to terminate the dangling bond as the hydrogen atom does.

From the above-described results, it is considered that a sufficiently high electron emission efficiency is obtained when the electron spin density in the first semiconductor layer 103 is about $10^{18}cm^{-3}$ or more. This is because when the electron spin density is higher, the injection efficiency of the electrons from the first conductive electrode 102 to the first semiconductor layer 103 is higher. The electron spin density is preferably about $1 \times 10^{18}cm^{-3}$ or more, and more preferably about $1 \times 10^{19}cm^{-3}$ or more.

In the electron emission element 100 in this example, unlike the conventional structure described with reference to FIG. 7, the emitter, section is not sharp but is flat. Accordingly, a local current concentration does not occur, and the emitter section is not damaged by such a concentration. Therefore, the life is extended and the operating current is stabilized.

As described above, in this example, the electron emission element realizes a high electron emission efficiency by preventing the dangling bond in the first semiconductor layer 103 to be terminated and thus obtaining an appropriate electron spin density (density of unpaired electron or dangling bond), which is different from the case of the conventional, general use of an amorphous silicon layer. The method for producing the first semiconductor layer 103, the second semiconductor layer 104, and the insulating layer 105 is not limited to sputtering described above. Deposition methods which are generally used by the semiconductor technologies, such as an electron beam evaporation or various chemical vapor deposition (CVD) methods can be used as long as an appropriate electron spin density (density of unpaired electron or dangling bond) in the above-described range is obtained.

The first semiconductor layer 103 can be formed of an amorphous silicon layer containing no hydrogen. Alternatively, after the first semiconductor layer 103 is formed of a hydrogenated amorphous silicon layer, the hydrogen can be released from the first semiconductor layer 103 by heat treatment performed at about 600° C. or higher in an electric oven. In such cases where an appropriate electron spin density (density of unpaired electron or dangling bond) in the above range is obtained through these methods, the above-described features (effects) can be achieved.

EXAMPLE 2

In a second example according to the present invention, an amorphous silicon layer containing nitrogen or carbon is formed using gas containing nitrogen atoms (e.g., $N_2$, $NH_3$, $NF_3$,$N_2O$, or NO) or carbon atoms (e.g., CO, $CO_2$,$CH_4$, $C_2H_6$, $C_3H_8$, or $C_2H_2$) as the first semiconductor layer 103, In lieu of using the gas containing oxygen as in the electron emission element 100 in the first example. The other components are identical with those in the first example, and descriptions thereof will be omitted.

The electron emission characteristics of the element in this example were examined in a similar manner as in the first example. The results were substantially the same as those obtained with the element 100 in the first example. Even after a continuous operation for 1000 hours or more, the electron emission characteristics did not substantially change. The element in this example was confirmed to have a long life and to be superior in operating stability. Notably, in order to obtain the above-described characteristics, the nitrogen or carbon content in the first semiconductor layer 103 formed of an amorphous silicon layer containing nitrogen or carbon is preferably set to be about 0.0001% by atom to about 10% by atom. Due to such setting, the electron spin density of the first semiconductor layer 103 is set to be in an appropriate range described in the first example, and thus similar features (effects) to those in the first example are achieved.

In the case where the first semiconductor layer 103 contains a plurality of types of atoms among oxygen atoms, carbon atoms and nitrogen atoms, the electron spin density of the first semiconductor layer 103 is set to be in an appropriate range described in the first example, as long as the sum of the contents of the contained atoms is in the range of about 0.0001% by atom to about 10% by atom. Thus, equivalent characteristics to those of the electron emission element in the first example are obtained.

EXAMPLE 3

In a third example according to the present invention, the first semiconductor layer 103 and the second semiconductor layer 104 are formed of amorphous germanium using a Ge target in lieu of the Si target used with the electron emission element 100 produced in the first example. The insulating layer 105 is formed of an $SiO_x$ or $GeO_x$ layer (where x is 0.25 or more but 2 or less). The other components are identical with those in the first example, and descriptions thereof will be omitted.

The electron emission characteristics of the element in this example were examined in a similar manner as in the first example. The results were substantially the same as those obtained with the element 100 in the first example,

EXAMPLE 4

In a fourth example according to the present invention, the first semiconductor layer 103 and the second semiconductor layer 104 are formed of amorphous carbon using a graphite target in lieu of the Si target used with the electron emission element 100 produced in the first example. The insulating layer 105 is formed of an $SiO_x$ or $GeO_x$ layer (where x is 0.25 or more but 2 or less) The other components are identical with those in the first example, and descriptions thereof will be omitted.

The electron emission characteristics of the element in this example were examined in a similar manner as in the first example. The results were substantially the same as those obtained with the element 100 In the first example.

EXAMPLE ≡

In a fifth example according to the present invention, the insulating layer 105 is formed of an $Si_{1-x}C_xO_y$ or $Ge_{1-x}C_xO_y$ layer (where 0<x<1, and y is 0.25 or more but 2 or less) in lieu of the $SiO_x$ layer used with the electron emission element 100 produced in the first example. The other components are identical with those in the first example, and descriptions thereof will be omitted.

The electron emission characteristics of the element in this example were examined in a similar manner as in the first example. The results were substantially the same as those obtained with the element 100 in the first example.

EXAMPLE 6

In a sixth example according to the present invention, a first electron emission element including an amorphous germanium layer as the first semiconductor layer 103, in lieu of using an amorphous silicon layer as in the electron emission element 100 in the first example, is produced. A second electron emission element including an amorphous carbon layer of the second semiconductor layer 104, in lieu of using an amorphous silicon layer as in the electron emission element 100 in the first example, is produced. In each of the first and second electron emission elements, the other components are identical with those in the first example, and descriptions thereof will be omitted.

The electron emission characteristics of the first and second electron emission elements in this example were examined in a similar manner as in the first example. The results were substantially the same as those obtained with the element 100 in the first example.

In the case where the first semiconductor layer 103 and the second semiconductor layer 104 are formed of different materials from each other, preferable results are obtained by combining materials so that the forbidden band width of the material of the second semiconductor layer 104 is larger than the forbidden band width of the material of the first semiconductor layer 103 as described above. When materials are combined so that the forbidden band width of the material of the second semiconductor layer 104 is smaller than the forbidden band width of the material of the first semiconductor layer 103 (e.g., when the first semiconductor layer 103 is formed of amorphous silicon, and the second semiconductor layer 104 is formed of amorphous germanium), the electron emission efficiency is significantly reduced.

EXAMPLE 7

Figure 2:
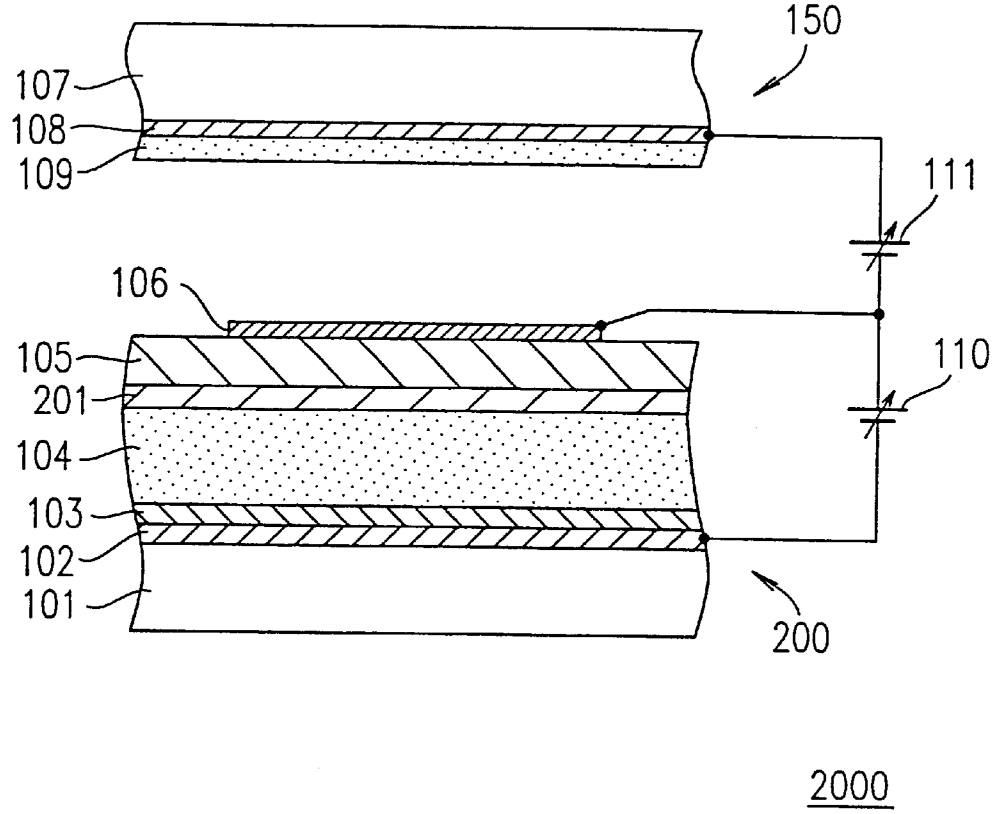
FIG. 2 is a schematic view showing a structure of an electron emission element in another example according to the present invention, and a structure of a field emission type display device configured using the same.

FIG. 2 is a schematic structural view of an electron emission element 200 in a seventh example according to the present invention and a field emission type display device 2000 using the same.

The electron emission element 200 is produced in the following manner after the second semiconductor layer 104 is formed in a similar process to that used for the electron emission element 100 in the first example. $O_2$ gas is introduced into the sputtering apparatus while increasing the amount of the $O_2$ gas. Thus, as shown in FIG. 2, a graded layer 201 is formed between the insulating layer 105 formed of $SiO_x$ (where x is 0.25 or more but 2 or less) and the second semiconductor layer 104. The graded layer 201 preferably has a thickness of about 0.01 $\mu$m, and the insulating layer 105 has a thickness of about 0.4 $\mu$m.

Then, as a second conductive electrode 106, an Au or Pt thin film is formed by sputtering or vacuum evaporation to a thickness of about 10 nm. In this manner, the electron emission element 200 is formed. By locating an anode substrate 150 opposed to the electron emission element 200 as in the case of the field emission type display device 1000 in the first example, the field emission type display device 2000 is formed.

The other components of the electron emission element 200 and the field emission type display device 2000 are identical with those in the element 100 and the display device 1000 in the first example, and descriptions thereof will be omitted.

The electron emission characteristics of the element 200 in this example were measured in a similar manner as in the first example. The phosphor thin layer 109 was observed to emit light under the bias conditions that the voltage of the DC power supply 110 was about 50 V to about 100 V and the voltage of the DC power supply 111 was about 5 kV. The electron emission efficiency at this point ratio of the current flowing through the DC power supply 111 with respect to the current flowing through the DC power supply 110 was as high as about 10% to about 35%. The density of the current flowing between the second conductive electrode 106 and the phosphor thin film 109 exceeded about 1 $mA/cm^2$. Thus, the element was confirmed to have a large operating current. Such a larger operating current is considered to be obtained because the graded layer 201 provided between the second semiconductor layer 104 and the insulating layer 105 allows the injection of the electrons from the second semiconductor layer 104 to the insulating layer 105 to be performed more efficiently.

EXAMPLE 8

In an eighth example according to the present invention, a series of electron emission elements were formed, with the thickness of the graded layers 201 produced for the electron emission element 200 in the seventh example being varied. The operating characteristics of the electron emission elements were examined.

When the thickness of the graded layer 201 was less than about 0.01 $\mu$m, the electron emission efficiency was substantially the same as that of the electron emission element 100 in the first example. When the thickness of the graded layer 201 was equal to or more than about 0.4 μm, the voltage of the DC power supply 110 at which the electron emission started was increased to about 120 V to about 250 V.

Based on these results, the thickness of the graded layer 201 is preferably about 0.01 μm or more and leas than the thickness of the insulating layer 105.

EXAMPLE 9

Figure 3:
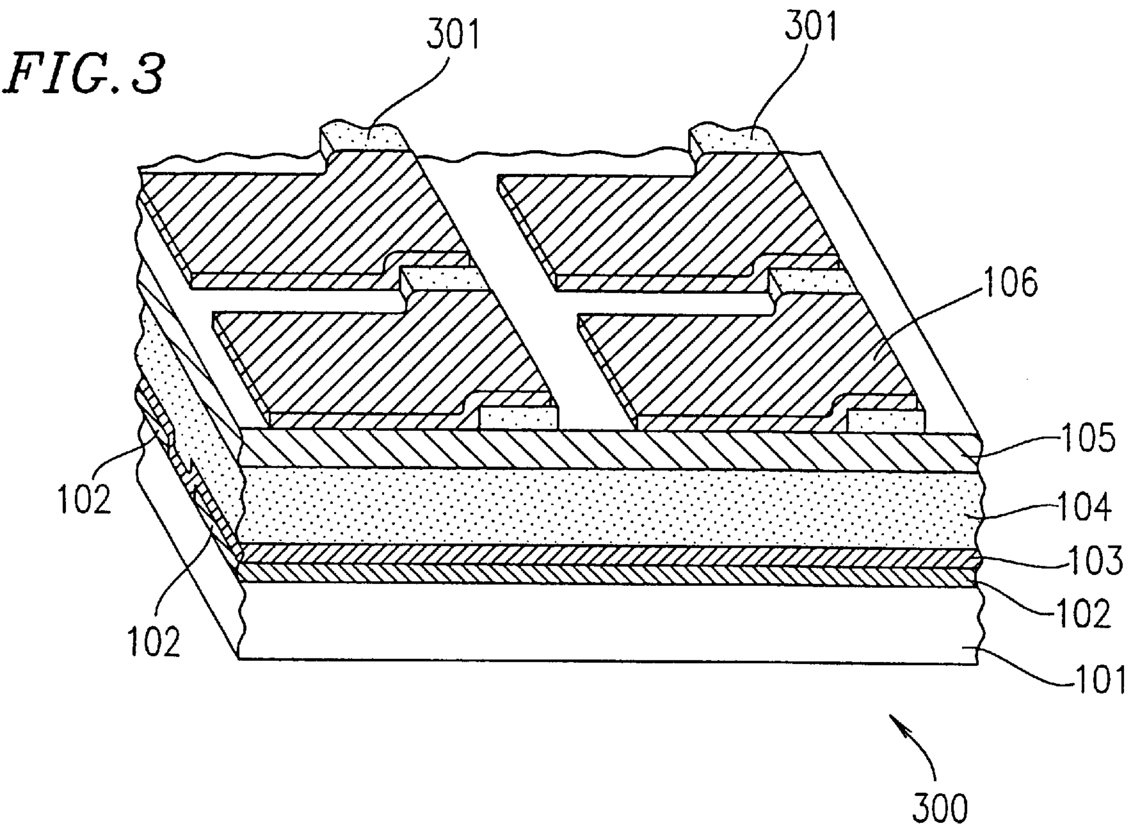
FIG. 3 is a schematic view showing a structure of an electron emission element array according to the present invention, which is obtained by arranging the electron emission elements shown in FIG. 1 in an array.

In this example, an electron emission element array 300 is formed by forming a plurality of electron emission elements on a single substrate as shown in FIG. 3.

Specifically, a first conductive electrode 102 formed of an Al-Li alloy containing Li in an amount of about 1% by atom to about 30% by atom is formed by vacuum evaporation or sputtering on a glass substrate 101 to a thickness of about 0.05 μm to about 0.5 μm. At this point, a mask having an appropriate pattern is used to form the first conductive electrode 102 in the form of 480 rectangular electrode patterns which are electrically insulated from one another.

Next, in a similar manner to that in the first example, an amorphous silicon layer containing oxygen is formed to a thickness of about 1 nm to about 100 nm, typically about 5 nm to about 50 nm by radio frequency sputtering using a Si target. Thus, a first semiconductor layer 103 in formed. Then, an amorphous silicon layer is formed to a thickness of about 1 μm to about 10 μm, typically about 2 μm to about 6 μm using only the noble gas in the same sputtering apparatus. Thus, a second semiconductor layer 104 in formed. Thereafter, gas containing oxygen atoms in molecules thereof is introduced into the same sputtering apparatus in addition to the above-mentioned noble gas, thereby forming an $SiO_x$ layer (where x is 0.25 or more and 2 or less) to a thickness of about 4 μm. Thus, an insulating layer 105 is formed. A rectangular electrode 301 used for interconnection is formed of metals such as, for example, Au, Cu, Al, Cr, Ti, Pt, Pd, Mo or Ag by vacuum evaporation or sputtering. At this point, a mask having a prescribed pattern is used to form the electrode 301 in the form of a total of 640 rectangular electrode patterns arranged in a direction perpendicular to the first conductive electrode 102.

Thereafter, a Pt thin film is formed by sputtering or vacuum evaporation to a thickness of about 1 nm to about 10 nm, typically about 5 nm to about 20 nm as a second conductive electrode 106. At this point, a mask having an appropriate pattern is used to form the second conductive electrode 106 in the form of an array of 480×640 island-shaped electrodes. Each of the island-shaped electrodes 106 is electrically connected to one of the interconnection electrode 301.

Thus, an electron emission array 300 is formed. By locating an anode substrate 150 opposed to the electron emission element array 300, a field emission type display device is formed.

The electron emission characteristics of the electron emission element array 300 were measured in a similar manner as in the first example. When a DC voltage was applied between the first conductive electrode 102 and the interconnection electrodes 301, light emitted by a phosphor layer 109 displayed a monochrome image. Even after a continuous operation for 1000 hours or more, the brightness of the light from the phosphor layer 109 did not substantially change. Thus, the array was confirmed to have a long life and to be superior in operating stability.

The insulating layer 105 can be formed of, in lieu of $Si_{1-x}O_x$, a material having a larger forbidden band width than that of the material of the second semiconductor layer 104, such as, for example, $Si_{1-x}N_x$ (0<x<0.57), $Si_{1-x}C_x$ (0<x<1), $Ge_{1-x}C_x$ (0.3<x−1), $Ge_{1-x}O_x$ (0.2<x<1), $Ge_{1-x}N_x$ (0.2<x<0.57), hydrogenated amorphous carbon (a-C:H), diamond, AlN, BN, $Al_2O_3$, MgO, $CaF_2$ or $MgF_2$. Similar effects are obtained.

A higher efficiency is obtained by providing a graded layer 201 between the second semiconductor layer 104 (amorphous silicon) and the insulating layer ($SiO_x$) 105 as described in the seventh and eighth examples.

A color image can be displayed by locating three types of phosphor materials emitting R, G and B light, as phosphor layers 109, in correspondence with the plurality of second conductive electrodes 106 provided in an array.

The first conductive electrodes 102, the interconnection electrodes 301 and the second conductive electrodes 106 are formed using a mask in the above description. Alternatively, a photolithography method or a lift-off method can be used to form a desired electrode pattern.

EXAMPLE 10

Figure 4:
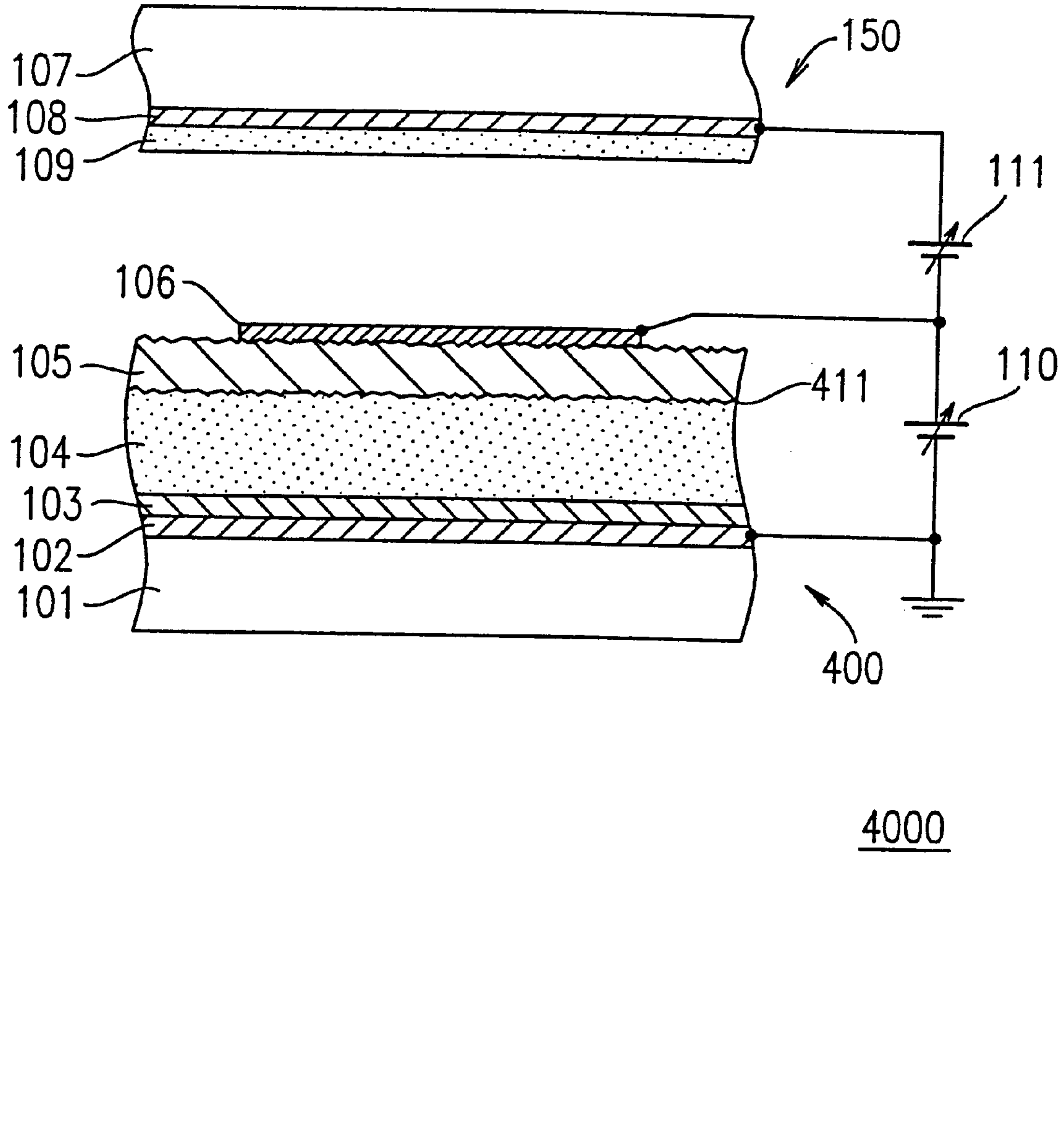
FIG. 4 is a schematic view showing a structure of an electron emission element in still another example according to the present invention, and a structure of a field emission type display device configured using the same.

FIG. 4 is a schematic structural view of an electron emission element 400 in a tenth example according to the present invention and a field emission type display device 4000 using the same. Hereinafter, the structures and production methods of the electron emission element 400 and the field emission type display device 4000 will be described with reference to FIG. 4.

First, a thin film of Al, Al—Li alloy, Mg, Mg—Ag alloy, Ag, Cr, W, Mo, Ta or Ti is formed on a glass substrate 101 as a first conductive electrode 102 by sputtering or vacuum evaporation to a thickness of about 0.01 μm to about 100 μm, typically about 0.05 μm to about 1 μm.

Next, a hydrogenated amorphous silicon (hereinafter, referred to simply as “a-Si:H”) thin film containing oxygen is formed to a thickness of about 1 nm to about 100 nm by a capacitance-coupled plasma CVD method with parallel electrodes using a mixture gas containing $SiH_4$, hydrogen, and a gas containing oxygen atoms described in the first example. Thus, a first semiconductor layer 102 is formed. Then, a silicon thin film including an amorphous area and a microcrystalline area in a mixed state is formed to a thickness of about 2 μm, using a mixture gas obtained by diluting $SiH_4$ with hydrogen (volume ratio at the time of dilution:$H_2$/$Si_4$=10 or more). Thus, a second semiconductor layer 104 is formed. The first and second semiconductor layers 103 and 104 are formed under the conditions that the substrate heating temperature is about 200° C. to about 400° C., typically about 250° C. to about 350° C., the pressure is about 0.2 Torr to about 1.0 Torr, typically about 0.5 Torr is about 1 Torr, the area of the radio frequency electrode is about 120 $cm^2$, and the radio frequency power is about 5 W to about 50 W, typically about 10 W to about 30 W.

Sequentially, an $SiO_x$ layer (where x is 0.25 or more but 2 or less) is formed to a thickness of about 0.4 μm by a similar plasma CVD method using a mixture gas containing $SiH_4$, hydrogen, and a gas containing oxygen atoms mentioned above. Thus, an insulating layer 105 is formed. Then, as a second conductive electrode 106, a metal thin film having a work function larger than that of the material of the first conductive electrode 102 (e.g., Au, Pt, Ni or Pd) is formed by sputtering or vacuum evaporation to a thickness of about 1 nm to about 100 nm, typically about 5 nm to about 20 nm.

Thus, an electron emission element 400 is formed.

The electron emission element 400 is used as a cathode. An anode substrate 150 including a transparent electrode 108 formed of ITO, $SnO_2$ or the like and a phosphor thin film 109 deposited on a glass substrate 107 is located opposed to the cathode. Thus, the field emission type display device 4000 is formed.

The electron emission characteristics of the element 400 of this example were measured as in the first example. Under the biasing conditions that the voltage of the DC power supply 110 is about 10 V to about 200 V and the voltage of the DC power supply 111 is about 3 kV to about 10 kV, electrons were observed to be emitted into the vacuum from the surface of the second conductive electrode 106 and accelerated by the electric field generated by the DC power supply 111 to collide with the phosphor thin film 109, thereby causing the phosphor thin film 109 to emit light.

The electron emission efficiency ratio of the current flowing through the DC power supply 111 with respect to the current flowing through the DC power supply 110 of the element was as high as about 5% to about 30%. The density of the current flowing between the second conductive electrode 106 and the phosphor thin film 109 exceeded about 1 $mA/cm^3$. Thus, the element was confirmed to have a large operating current.

The brightness of the light emitted from the phosphor thin film 109 was higher than the brightness of the conventional structure shown in FIG. 7 by two to three digits. Even after a continuous operation of 1000 hours or more, the electron emission efficiency of the electron emission element 100 did not substantially change. Thus, the electron emission element 400 in FIG. 4 was confirmed to have a long life and to be superior in operating stability.

The reasons why the electron emission element 400 has a high electron emission efficiency and a larger operating current, compared to that of the conventional element, which realizes a high brightness, were studied. As a result, these features were found to be caused by the irregularities at an interface 411 between the second semiconductor layer 104 and the insulating layer 105. This will be explained below.

First, a comparative electron emission element was produced under the same conditions as the electron emission element 104 of the electron emission element 400, a second semiconductor layer was formed of a silicon thin film containing hydrogen using a mixture gas containing $H_2$ and $SiH_4$ at the volume ratio of $H_2$:$SiH_4$=8:1. As a result of examining the electron emission characteristics of the comparative electron emission element in a similar manner, little current flow was observed even when the voltage of the DC power supply 110 was increased, and the emission efficiency was smaller than that of the element 400 in this example by one digit. The reasons of such a significant difference in the electron emission efficiency between the two elements which are different from each other in the production conditions of the second semiconductor layer were studied as follows.

The second semiconductor layer 104 of the element 400 in this example was analyzed by a transmission electron microscope. In the layer 104, a microcrystalline area and an amorphous area existed in a mixed state. Microcrystalline particles grown to a column-like shape were found in the microcrystalline area. The size of the microcrystalline particles was about 5 nm to about 500 nm in a thickness direction and about 1 nm to about 50 nm in a direction perpendicular to the thickness direction. It was found that as the ratio of $H_2$ with respect to $SiH_4$ at the time of production is increased, the size of the microcrystalline particles increases accordingly, so that the ratio of the microcrystalline area with respect to the amorphous area is increased.

Figure 5:
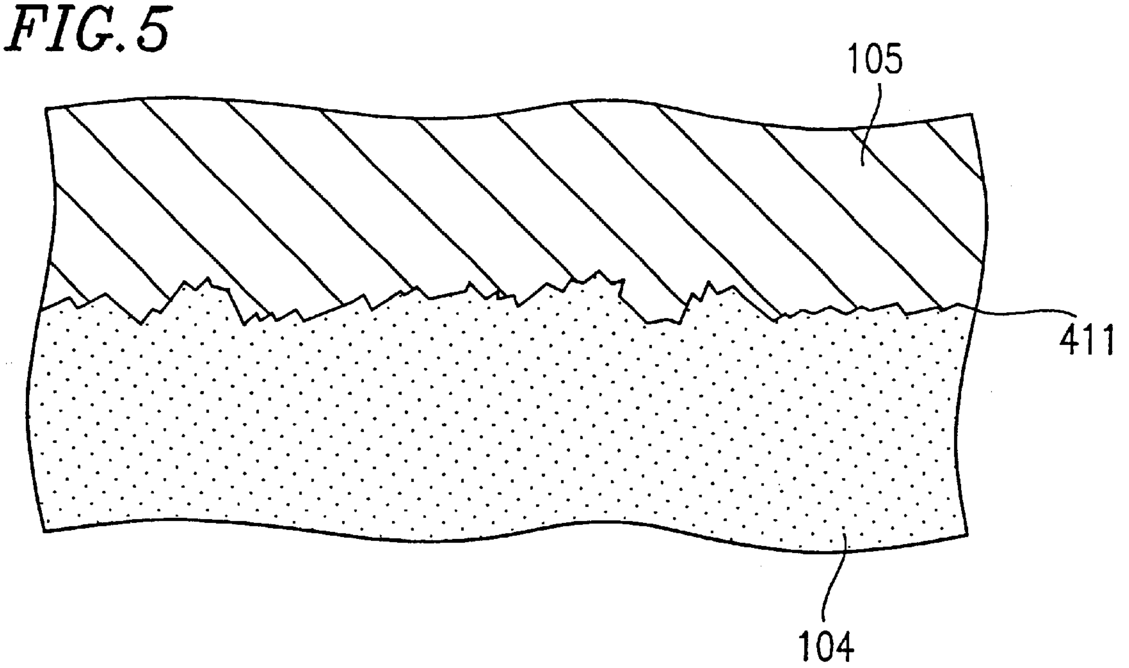
FIG. 5 is an enlarged schematic view showing a shape of an interface of the electron emission element shown in FIG. 4.

The surface of the second semiconductor layer 104 (i.e., the interface 411 between the second semiconductor layer 104 and the insulating layer 105) in the element 400 was observed with an electron microscope. It was confirmed that, as shown in the schematic enlarged view of FIG. 5, non-uniform irregularities which are not periodic or uniform in height were formed. The height difference among the irregularities was about 5 nm at the minimum and about 200 nm at the maximum. The average was about 50 nm to about 100 nm. The size of the element 400 used for observation was 2 mm×2 mm.

The second semiconductor layer is the comparative element is a uniform a-Si:H layer, and the surface is like a mirror-surface. It was found that the irregularities found in the element 400 in this example were not formed at an interface between the second semiconductor layer (uniform a-Si:H layer) and an insulating layer.

Whereas the element 400 had irregularities also on the surface of the insulating layer 105, no irregularities were found on the surface of the insulating layer in the comparative element in which the interface between the second semiconductor layer (uniform a-Si:H layer) and the insulating layer was flat. Based on this, the irregularities on the surface of the insulating layer 105 of the element 400 are not caused by the insulating layer 105 but reflect the surface state of the interface 411, i.e., the second semiconductor 104.

Based on these results, the high electron emission efficiency of the electron emission element 400 in this example is caused by the irregularities on the interface 411. In other words, the interface 411 having the irregularities is considered to have the following effects. The interface 411 provides a larger junction area than a flat interface. The intensity of the electric field is locally increased at the peaks on the interface 411, thereby increasing the efficiency of electron injection from the second semiconductor layer 104 to the insulating layer 105. As a result, the number of electrons flowing through the insulating layer 105 is increased.

Since the voltage of the DC power supply 110 is mostly applied to the insulating layer 105, the electrons moving through the insulating layer 105 are significantly accelerated. Since the second conductive electrode 106 is thin, the electrons pass through the second conductive electrode 106 and are emitted into the vacuum. The emitted electrons collide with the phosphor thin layer 109 due to the electric field generated by the DC power supply 111 and thus causes the phosphor thin layer 109 to emit light. Accordingly, an increase in the number of electrons injected into the insulating layer 105 due to the function of the irregularities of the interface 411 directly leads to an increase in the brightness of the light emitted by the phosphor thin layer 109.

In the electron emission element 100 in this example, unlike the conventional structure described with reference to FIG. 7, the emitter section is not sharp but is flat. Accordingly, a local current concentration does not occur, and the emitter section is not damaged by such a concentration. Therefore, the life is extended and the operating current is stabilized.

EXAMPLE 11

In an eleventh example according to the present invention, after a second semiconductor layer 104 is formed of a-Si:H as in the electron emission element 400 in the tenth example, the second semiconductor layer 104 is heated to about 600° C. or more in an electron oven to grow microcrystals in the second semiconductor layer 104. Then, an insulating layer 105 and a second conductive layer 106 are formed. The other components are identical with those in the tenth example, and descriptions thereof will be omitted.

The electron emission characteristics of the element in this example were examined in a similar manner as in the tenth example. The results were substantially the same as those obtained with the element 400 in the tenth example.

The same results were obtained when microcrystals were grown by irradiating the a-Si:H layer 104 with an excimer laser or an electron beam.

EXAMPLE 12

In a twelfth example according to the present invention, a series of electron emission elements were formed, with the thickness of the insulating layer 105 produced for the electron emission element 400 in the tenth example being varied, without varying the thickness of the first and second semiconductor layers 103 and 104. The operating characteristics of the electron emission elements were examined.

As a result, it was found that when the thickness of the insulating layer 105 is less than about 0.1 μm, the element may break down to prevent operation and thus cannot be used in practice. It was also found that when the thickness of the insulating layer 105 is more than about 5 μm, the insulating layer 105 tends to be peeled off due to internal stress, and a voltage applied by the DC power supply 110 needs to be about 1 kV or more. Such an element cannot be used in practice.

Accordingly, the thickness of the insulating layer 105 is preferably set in the range of about 0.1 μm to about 5 μm.

Furthermore, the relationship between the maximum depth of the irregularities at the interface 411 and the thickness of the insulating layer 105 was examined. The results are shown in Table 1. The maximum depth of the irregularities at the interface 411 was measured by cutting the electron emission element into a size of 2 mm×2 mm and observing the cross-section with an electron microscope as in the tenth example.

irregularities at the interface 411 is excessively large, a local portion having an abnormally large electric field is formed, which tends to cause dielectric breakdown of the insulating layer 105. When the height difference between the highest peak and the deepest recess of the irregularities at the interface 411 is excessively small, such an interface is not much different from a flat interface. Thus, a high electron emission efficiency is not obtained. In order to realize more satisfactory operating characteristics, the thickness of the insulating layer 105 needs to be adjusted in accordance with the height difference of the irregularities at the interface 411.

EXAMPLE 13

In a thirteenth example according to the present invention, a series of electron emission elements were formed, with the thickness of the second semiconductor layer 104 produced for the electron emission element 400 in the tenth example being varied, without varying the thickness of the insulating layer 105. The operating characteristics of the electron emission elements were examined.

As a result, it was found that when the thickness of the second semiconductor layer 104 is less than about 0.01 μm, the non-uniformity, i.e., existence of an amorphous area and a microcrystalline area in a mixed state, inside the second semiconductor layer 104 is also observed even on the surface of the second semiconductor layer 104. Consequently, the in-plane distribution (non-uniformity) of the electron emission efficiencies of the element becomes conspicuous. Thus, the electron emission efficiency of the entire element (i.e., the amount of operating current) is reduced and the life of the element is shortened. Such an element cannot be used in practice.

The change of operating characteristics was not observed by increasing the thickness of the second semiconductor layer 104 to about 50 μm.

EXAMPLE 14

In a fourteenth example according to the present invention, the second semiconductor layer 104 is formed of,

TABLE 1

| | | | | | | | | | |
|---|---|---|---|---|---|---|---|---|---|
| Thickness of insulating layer (nm) | 500 | 500 | 500 | 2000 | 2000 | 2000 | 5000 | 5000 | 5000 |
| Maximum depth of irregularities (nm) | 0.5 | 5 | 500 | 2 | 20 | 2000 | 5 | 50 | 5000 |
| Electron emission efficiency (%) | 0.1 | 25 | 28 | 0.1 | 22 | 26 | 0.1 | 20 | 24 |

Based on these results, a sufficiently high electron emission efficiency is obtained when the average value of the height and depth difference of the irregularities at the interface 411 is about 1/100 of the thickness of the insulating layer 105. The results shown in Table 1 indicate that the electron emission efficiency is higher when the thickness of the insulating layer 105 is equal to the maximum depth of the irregularities at the interface 411. In practice, however, dielectric breakdown of the insulating layer 105 tends to occur under such conditions, and thus the operating stability of the element is reduced and the life is shortened. Accordingly, such conditions are not appropriate to practical use.

As can be appreciated, when the height difference between the highest peak and the deepest recess of the in lieu of the Si layer containing microcrystalline particles used with the electron emission element 300 produced in the tenth example, a Ge, $Si_{1-x}C_x$ alloy, $Si_{1-x}Ge_x$ alloy, or $Ge_{1-x}C_x$ alloy layer (where $0<x<1$) containing microcrystals having approximately the same size. The other components are identical with those in the tenth example, and descriptions thereof will be omitted.

The electron emission characteristics of the element in this example were examined in a similar manner as in the tenth example. The results were substantially the same as those obtained with the element 400 in the tenth example.

The diameter of the microcrystalline particles was allowed to increase by one digit by mixing gas containing fluorine such as, for example, $F_2$, $SiF_4$, $CF_4$ or $GeF_4$ in the source gas when forming the second semiconductor layer 104 of the above-described material.

When gas such as $PF_3$, $PH_3$ or $AsH_3$ is mixed in the source gas and impurities such as, for example, P or As in an amount of about 0.01 ppm to about 1000 ppm are added to the second semiconductor layer 104, the electrons can be injected from the second semiconductor layer 104 to the insulating layer 105 by a small electric field. Thus, the voltage applied by the DC power supply 110 at which electron emission is started is reduced.

EXAMPLE 15

In a fifteenth example according to the present invention, the process for producing the electron emission element 400 in the tenth example is modified as described below.

First, a conductive electrode 102 formed of an Al—Li alloy containing Li in an amount of about 1% by atom to about 30% by atom was formed on a glass substrate 101 by sputtering or vacuum evaporation to a thickness of about 0.05 μm to about 0.5 μm. Then, the electrode 102 was etched to a depth of about 1 nm to about 100 nm from a surface thereof in a thickness direction by chemical dry etching or reactive ion etching using halogen radicals or halogen ions. The halogen radicals or halogen ions were produced by decomposing gas containing halogen atoms (e.g., $CF_4$, $C_2F_6$, $NF_3$, $ClF_3$, $F_2$, $SF_4$, HF, $Cl_2$ or HCl gas) by glow discharge.

Sequentially, an a-Si:H layer (first semiconductor layer) 103 containing oxygen was formed to a thickness of about 10 nm to about 100 nm by plasma CVD using a mixture gas to $SiH_4$ and oxygen. Then, a-Si:H layer (second semiconductor layer) 104 was formed to a thickness of about 1 μm to about 5 μm by plasma CVD using a mixture gas containing $H_2$ and $SiH_4$ having a ratio of $H_2SiH_4$ of about 0 to about 10. The first and second semiconductor layers 103 and 104 were formed where the substrate heating temperature was about 150° C. to about 350° C. As a result of observing the surface of the a-Si:H layer 104 by a scanning electron microscope, irregularities having depths in the range of about 10 nm (minimum) to about 300 nm (maximum) were formed.

Next, an $SiO_x$ layer (where x is 1 to 1.6) was formed to a thickness of about 0.1 μm to about 0.6 μm by plasma CVD using a mixture gas containing $SiH_4$ and $O_2$ having a ratio of $SiH_4/O_2$ of about 0.5 to about 4 and also containing $H_2$. Thus, an insulating layer 105 was formed. Then, as a second conductive electrode 106, a Pt thin film was formed by sputtering to a thickness of about 10 nm. Thus, an electron emission element was formed.

The electron emission efficiency of the electron emission element thus obtained was measured as in the tenth example. The obtained value was as high as about 10% to about 305.

In the tenth example, when the second semiconductor layer 104 was formed of a-Si:H containing no microcrystalline particles, electron emission did not occur. On the other hand, in the case where the electrode 102 below the second semiconductor layer 104 is etched so that irregularities are formed at the surface of the electrode 102 utilizing the slight in-plane variation in the etching rate, desired irregularities can be obtained at the surface of the semiconductor layer where no irregularities are otherwise formed (e.g., the surface of the a-Si:H layer). Thus, the injection efficiency of electrons to the insulating layer 105 can be increased.

The similar effects can be obtained by forming the second semiconductor layer 104 of a-Ge:H, a-$Si_{1-x}C_x$:H alloy, a-Si:$_{1-x}Ge_x$:H alloy, a-$Ge_{1-x}C_x$:H alloy (where 0<x<1) or the like in lieu of a-Si:H. Furthermore, when impurities such as P, As, Sb or the like are added in an amount of about 1 ppm to about 10000 ppm to the second semiconductor layer 104 formed of such a material, the voltage applied by the DC power supply 110 at which electron emission is started is reduced.

Alternatively, similar effects can be obtained by forming the second semiconductor layer 104 of, in lieu of the above-mentioned amorphous materials, silicon, Ge, $Si_{1-x}C_x$ alloy, Si-$_{1-x}Ge_x$ alloy, $Ge_{1-x}C_x$ alloy or the like (where 0<x<1) containing at least microcrystals, which allows the second semiconductor layer 104 to have irregularities when formed.

Still alternatively, a semiconductor layer 104 of a two-layered structure can be formed by forming a semiconductor film containing microcrystals to a thickness of about 0.1 μm to about 1 μm without etching the surface of the first conductive layer 102, and then depositing thereon an amorphous semiconductor film to a thickness of about 0.5 μm to about 5 μm. In this case, irregularities having depths in the range of about 10 nm to about 300 nm are formed on the interface 411, and thus the similar effects can be obtained.

EXAMPLE 16

In a sixteenth example according to the present invention, a silicon wafer having a low resistance (about 1 Ωcm or less) is used in lieu of the first conductive electrode 102 used in the electron emission element produced in the fifteenth example. Since the silicon wafer also functions as a support, which is performed by the glass substrate 101 in the above-described examples, the glass substrate 101 can be omitted.

In this case also, the similar effects to those in the fifteenth example are obtained.

EXAMPLE 17

In the seventeenth example according to the present invention, the process for producing the electron emission element 400 in the tenth example is modified as described below.

First, a first conductive electrode 102 formed of an Al—Li alloy containing Li in an amount of about 1% by atom to about 30% by atom was formed on a glass substrate 101 by vacuum evaporation to a thickness of about 0.05 μm to about 0.5 μm.

Sequentially, an a-Si:H layer (first semiconductor layer) 103 containing oxygen was formed to a thickness of about 10 nm to about 100 nm by plasma CVD using a mixture gas of $SiH_4$ and oxygen. Then, an a-Si:H layer (second semiconductor layer) 104 was formed to a thickness of about 2 μm to about 5 μm by plasma CVD using a mixture gas containing $H_2$ and $SiH_4$ having a ratio of $H_2/SiH_4$ of about 0 to about 10. The first and second semiconductor layers 103 and 104 were formed where the substrate heating temperature was about 150° C. to about 350° C.

Then, the a-Si:H layer 104 was etched in a depth directions by about 0.1 μm to about 1 μm from a surface thereof by chemical dry etching or reactive ion etching using halogen radicals or halogen ions. The halogen radicals or halogen ions were produced by decomposing gas containing halogen atoms (e.g., $CF_4$, $C_2F_6$, $NF_3$, $ClF_3$, $F_2$, $SF_6$, HF, $Cl_2$ or HCl gas) by glow discharge. As a result of observing the surface of the a-Si:H layer 104 by a scanning electron microscope, irregularities having depths in the range of about 10 nm (minimum) to about 500 nm (maximum) were formed.

Next, an $SiO_x$ layer (where x is 1 to 1.6) was formed to a thickness of about 0.1 μm to about 0.6 μm by plasma CVD using a mixture gas containing $SiH_4$ and $O_2$ having a ratio of $SiH_4/O_2$ of about 0.5 to about 4 and also containing $H_2$. Then, an insulating layer 105 was formed. Then, as a second conductive electrode 106, a Pt thin film was formed by sputtering to a thickness of about 10 nm. Thus, an electron emission element was formed.

The electron emission efficiency of the electron emission element thus obtained was measured as in the tenth example. The obtained value was as high as about 10% to about 30%.

In the tenth example, when the second semiconductor layer 104 was formed of a-Si:H containing no microcrystalline particles, electron emission did not occur. On the other hand, in the case where the a-Si:H layer 104 is etched so that irregularities are formed at the surface of the a-Si:H layer 104 utilizing the slight in-plane variation in the etching rate, desired irregularities can be obtained at the surface of the semiconductor layer where no irregularities are otherwise formed (e.g., the surface of the a-Si:H layer). Thus, the injection efficiency of electrons to the insulating layer 105 can be increased.

Similar effects can be obtained by forming the second semiconductor layer 104 of a-Ge:H, a-$Si_{1-x}C_x$:H alloy, a-Si:$_{1-x}Ge_x$:H alloy, a $Ge_{1-x}C_x$:H alloy (where $0<x<1$) or the like in lieu of a-Si:H. Furthermore, when impurities such as P, As, Sb or the like are added in an amount of about 1 ppm to about 1000 ppm to the second semiconductor layer 104 formed of such a material, the voltage applied by the DC power supply 110 at which electron emission starts is reduced.

Alternatively, the similar effects can be obtained by forming the second semiconductor layer 104 of, in lieu of the above-mentioned amorphous materials, silicon, Ge, $Si_{1-x}C_x$ alloy, Si-$_{1-x}Ge_x$ alloy, $Ge_{1-x}C_x$ alloy or the like (where $0<x<1$) containing at least microcrystalline particles, which allows the second semiconductor layer 104 to have irregularities when formed.

EXAMPLE 18

Figure 6:
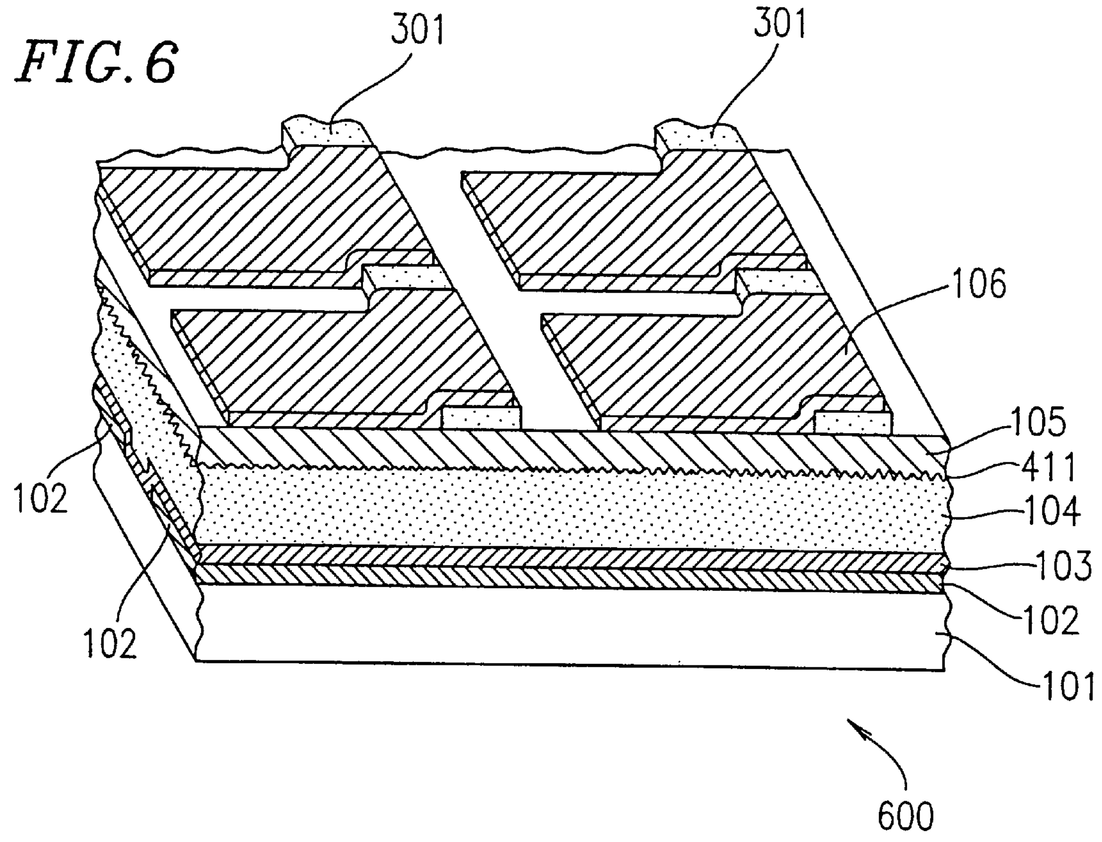
FIG. 6 is a schematic view showing a structure of an electron emission element array according to the present invention, which is obtained by arranging the electron emission elements shown in FIG. 4 in an array.

In this example, an electron emission element array 600 is formed by forming a plurality of electron emission elements on a single substrate as shown in FIG. 6.

Specifically, a first conductive electrode 102 formed on an Al—Li alloy containing Li in an amount of about 1% by atom to about 30% by atom is formed by vacuum evaporation or sputtering on a glass substrate 101 to a thickness of about 0.05 μm to about 0.5 μm. At this point, a mask having an appropriate pattern is used to form the first conductive electrode 102 in the form of 480 rectangular electrode patterns which are electronically insulated from one another.

Next, as in a similar manner to that in the tenth example, an a-Si:H thin film is formed to a thickness of about 1 nm to about 100 nm by a capacitance-coupled plasma CVD method with parallel electrodes using a mixture gas containing $SiH_4$, hydrogen and a gas containing oxygen atoms. Thus, a first semiconductor layer 103 is formed. Then, a silicon thin film including an amorphous area and a microcrystalline area in a mixed state and containing hydrogen is formed to a thickness of about 1 μm to about 5 μm, using a mixture gas obtained by diluting $SiH_4$ with hydrogen (volume ratio at the time of dilution: $H_2/SiH_4$=10 or more). Thus, a second semiconductor layer 104 is formed. The first and second semiconductor layers 103 and 104 are formed under the conditions that the substrate heating temperature is about 200° C. to about 400° C., typically about 250° C. to about 350° C., the pressure is about 0.2 Torr to about 1.0 Torr, typically about 0.5 Torr to about 1 Torr, the area of the radio frequency electrode is from about 120 $cm^2$, and the radio frequency power is about 5 W to about 50 W, typically about 10 W to about 30 W. At this point, the second semiconductor layer 104 has irregularities having depths in the range of about 30 nm to about 500 nm formed at a surface 411 thereof.

Sequentially, an $SiO_x$ layer (where x is 0.25 or more but 2 or less) is formed to a thickness of about 0.3 μm to about 0.5 μm by a similar plasma CVD method using a mixture gas containing $SiH_4$, hydrogen, and a gas containing oxygen atoms mentioned above. Thus, an insulating layer 105 is formed. Then, an electrode 301 used for interconnection is formed of metals such as, for example, Au, Cu, Al, Cr, Ti, Pt, Pd, Mo or Ag by vacuum evaporation or sputtering. At this point, a mask having an appropriate pattern is used to form the interconnection electrode 301 in the form of a total of 640 rectangular electrode patterns arranged in a direction perpendicular to the first conductive electrodes 102. Thereafter, a Pt thin film is formed by sputtering or vacuum evaporation to a thickness of about 1 nm to about 100 nm, typically about 5 nm to about 20 nm as a second conductive electrode 106. At this point, a mask having an appropriate pattern is used to form the second conductive electrode 106 in the form of an array of 480×640 island-shaped electrodes. Each of the island-shaped electrodes 106 is electrically connected to one of the interconnection electrodes 301.

In this manner, an electron emission element array 600 is formed. By locating an anode substrate opposed to the electron emission element array 600, a field emission type display device is formed.

The electron emission characteristics of the electron emission element array 600 were measured in a similar manner as in the first example. When a DC voltage was applied between the first conductive electrode 102 and the interconnection electrodes 301, light emitted by a phosphor layer 109 displayed a monochrome image. Even after a continuous operation for 1000 hours or more, the brightness of the light from the phosphor layer 109 did not substantially change. Thus, the array was confirmed to have a long life and to be superior in operating stability.

The insulating layer 105 can be formed, or lieu of $Si_{1-x}O_x$, a material having a larger forbidden band width than that of the material of the second semiconductor layer 104, such as, for example, $Si_{1-x}N_x$ ($0<x<0.57$), $Si_{1-x}C_x$ ($0<x<1$), $Ge_{1-x}C_x$ ($0.3<x<1$), $Ge_{1-x}O_x$ ($0.2<x<1$), $Ge_{1-x}N_x$ ($0.2<x<0.57$), hydrogenated amorphous carbon (a-C:H), diamond, AlN, BN, $Al_2O_3$, MgO, $CaF_2$ or $MgF_2$. Similar effects are obtained.

A color image can be displayed by locating three types of phosphor materials emitting R, G and B light, as phosphor layers 109, in correspondence with the plurality of second conductive electrodes 106 provided in an array.

The first conductive layers 102, the interconnection electrodes 301 and the second conductive layers 106 are formed using a mask in the above description. Alternatively, a photolithography method or a lift-off method can be used to form a desired electrode pattern.

INDUSTRIAL APPLICABILITY

As described above, according to the present invention, an electron emission having a large operating current with no deterioration of the emitter section, a long life, and superior operating stability and reliability is provided. Such an electron emission element can be easily produced.

What is claimed is:

1. An electron emission element having an emitter section for emitting electrons, wherein:

the emitter section includes, on a first conductive electrode, a structure in which at least a first semiconductor layer, a second semiconductor layer, an insulating layer and a second conductive electrode are deposited sequentially, and the first and second semiconductor layers include at least one of carbon, silicon and germanium as a main component, and the first semiconductor layer includes at least one type of atoms among carbon atoms, oxygen atoms and nitrogen atoms which is different from the main component.

2. An electron emission element according to claim 1, wherein the first semiconductor layer is amorphous.

3. An electron emission element according to claim 1, wherein the first semiconductor layer has an unpaired electron density of about $1\times10^{-}\text{cm}^{-2}$ or more.

4. An electron emission element according to claim 1, wherein the insulating layer includes at least one of carbon, silicon and germanium as a main component.

5. An electron emission element according to claim 1, wherein the second semiconductor layer and the insulating layer interpose therebetween a graded area where an element forming the second semiconductor layer and an element forming the insulating layer exist in a mixed state.

6. An electron emission element according to claim 5, wherein the graded area has a thickness which is about 0.01 $\mu$m or more and less than the thickness of the insulating layer.

7. An electron emission element according to claim 1, wherein at least an interface between the second semiconductor layer and the insulating layer has irregularities.

8. An electron emission element according to claim 7, wherein the irregularities at the interface has a maximum depth which is about 1/100 or more of the thickness of the insulating layer and less than the thickness of the insulating layer.

9. An electron emission element according to claim 1, wherein an interface between the first conductive electrode and the first semiconductor layer has irregularities.

10. An electron emission element according to claim 1, wherein the second semiconductor layer includes at least microcrystals.

11. An electron emission element according to claim 10, wherein the first and second semiconductor layers include at least hydrogen.

12. An electron emission element according to claim 10, wherein the second semiconductor layer includes therein an amorphous area and a microcrystalline area in a mixed state.

13. An electron emission element according to claim 10, wherein the microcrystals included in the second semiconductor layer has a diameter of about 1 nm to about 500 nm.

14. A field emission type display device including an electron emission element according to claim 1, configured so that a surface of the second conductive electrode of the electron emission element functions as an electron emission source of the display device.

15. A method for producing an electron emission element, comprising the steps of:

forming a first conductive electrode;

bringing halogen ions or halogen radicals into contact with a surface of the first conductive electrode, thereby forming irregularities; and sequentially forming a first semiconductor layer, a second semiconductor layer, an insulating layer, and a second conductive electrode on the surface of the first conductive electrode.

16. A method for producing a field emission type display device, comprising the steps of:

producing an electron emission element according to a method according to claim 15;

forming an anode substrate having a phosphor layer as a top surface; and arranging a surface of the second conductive electrode of the electron emission element and the phosphor layer of the anode substrate to be opposed to each other, thereby causing the surface of the second conductive electrode to function as an electron emission source to the phosphor layer.

17. A method for producing an electron emission element, comprising the steps of:

forming a first conductive electrode;

decomposing a mixture gas by glow discharge, the mixture gas being obtained by diluting gas containing silicon atoms with a ten fold or more volume ratio of hydrogen gas, thereby sequentially forming a first semiconductor layer and a second semiconductor layer on a surface of the first conductive electrode; and sequentially forming an insulating layer and a second conductive electrode on a surface of the second semiconductor layer.

18. A method for producing a field emission type display device, comprising the steps of:

producing an electron emission element according to a method according to claim 17;

forming an anode substrate having a phosphor layer as a top surface; and arranging a surface of the second conductive electrode of the electron emission element and the phosphor layer of the anode substrate to be opposed to each other, thereby causing the surface of the second conductive electrode to function as an electron emission source to the phosphor layer.

19. A method for producing an electron emission element, comprising the steps of:

sequentially forming a first conductive electrode, a first semiconductor layer, and a second semiconductor layer;

bringing halogen ions or halogen radicals into contact with a surface of the first semiconductor layer or the second semiconductor layer, thereby forming irregularities; and sequentially forming an insulating layer and a second conductive electrode on the surface of the second semiconductor layer.

20. A method for producing a field emission type display device, comprising the steps of:

producing an electron emission element according to a method according to claim 19;

forming an anode substrate having a phosphor layer as a top surface; and arranging a surface of the second conductive electrode of the electron emission element and the phosphor layer of the anode substrate to be opposed to each other, thereby causing the surface of the second conductive electrode to function as an electron emission source to the phosphor layer.

21. A method for producing an electron emission element, comprising the steps of:

sequentially forming a first conductive electrode, a first semiconductor layer, and a second semiconductor layer;

heating the first and second semiconductor layers, thereby growing microcrystals at least in the second semiconductor layer; and sequentially forming an insulating layer and a second conductive electrode on a surface of the second semiconductor layer.

22. A method for producing a field emission type display device, comprising the steps of:

producing an electron emission element according to a method according to claim 21;

forming an anode substrate having a phosphor layer as a top surface; and arranging a surface of the second conductive electrode of the electron emission element and the phosphor layer of the anode substrate to be opposed to each other, thereby causing the surface of the second conductive electrode to function as an electron emission source to the phosphor layer.

* * * * *

UNITED STATES PATENT AND TRADEMARK OFFICE

CERTIFICATE OF CORRECTION

PATENT NO. : 6,274,881 B1
DATED : August 14, 2001
INVENTOR(S) : Akiyama et al.

It is certified that error appears in the above-identified patent and that said Letters Patent is hereby corrected as shown below:

<u>Title page,</u>
Item [56], References Cited, FOREIGN PATENT DOCUMENTS, add the following:

| | | |
|---|---|---|
| -- 5-342995 | 12/1993 | Japan |
| 7-6687 | 1/1995 | Japan -- |

OTHER PUBLICATIONS, add the following:
-- International Search Report dated December 22, 1998 for PCT/JP98/03777

K. Yokoo, JOURNAL OF THE INSTITUTE OF ELECTRICAL ENGINEERS OF JAPAN, Vol. 112, No. 4, pp. 257-262, 1992

J. Ito, OYO BUTURI, Vol. 59, No. 2, pp. 164-169, 1990

Microfilm of the specification and drawings annexed to the request of Japanese Utility Model Application No. 66218/1980 (Laid-Open No. 167456/1981) (Hitachi, Ltd.), 11 December 1981, Full text, Figs. 1-5 --

<u>Column 21,</u>
Line 11, "$1 \times 10^{-} cm^{-2}$" should read -- $1 \times 10^{18} cm^{-3}$ --

Signed and Sealed this

Sixteenth Day of April, 2002

*Attest:*

JAMES E. ROGAN

*Attesting Officer*

*Director of the United States Patent and Trademark Office*

UNITED STATES PATENT AND TRADEMARK OFFICE
CERTIFICATE OF CORRECTION

PATENT NO. : 6,274,881 B1
DATED : August 14, 2001
INVENTOR(S) : Akiyama et al.

It is certified that error appears in the above-identified patent and that said Letters Patent is hereby corrected as shown below:

Column 1,
Line 35, “$mission” should read -- emission --.

Column 2,
Line 26, “the, current” should read -- the current --.
Line 38, “It in very” should read -- It is very --.
Line 46, “show$” should read -- shows --.
Line 51, “method f or” should read -- method for --.

Column 4,
Line 23, “achieved,” should read -- achieved. --.
Line 42, “same,” should read -- same. --.
Line 58, “drawings,” should read -- drawings. --.

Column 5,
Line 13, “MHZ” should read -- MHz --.
Line 26, “300° C” should read -- 300°C --, “400° C” should read -- 400°C -- and “350° C” should read -- 350°C --.
Line 33, “105 .” should read -- 105. --.
Line 35, “that Of” should read -- that of --.
Line 67, “currant” should read -- current --.

Column 6,
Line 3, “IN FIG. 7” should read -- in FIG. 7 --.
Line 4, “1000 hours” should read -- 1000 hours --.
Line 58, “In the case” should read -- in the case --.

Column 7,
Line 5, “barrier,” should read -- barrier. --.

Column 8,
Line 18, “600° C” should read -- 600°C --.

UNITED STATES PATENT AND TRADEMARK OFFICE

CERTIFICATE OF CORRECTION

PATENT NO. : 6,274,881 B1
DATED : August 14, 2001
INVENTOR(S) : Akiyama et al.

It is certified that error appears in the above-identified patent and that said Letters Patent is hereby corrected as shown below:

Column 9,
Line 9, "example," should read -- example. --.
Line 19, "less)" should read -- less). --.
Line 25, "In the first" should read -- in the first --.
Line 27, "EXAMPLE =" should read -- EXAMPLE 5 -- as shown on page 20, line 4 of the specification filed on April 27, 1999.

Column 11,
Line 30, "104 in" should read -- 104 is -- as shown on page 24, line 18 of the specification filed on April 27, 1999.

Column 12,
Line 45, "$Si_4$" should read -- $SiH_4$ -- as shown on page 27, line 12 of the specification filed on April 27, 1999.
Lines 48-49, "200° C" should read -- 200°C --, "400° C" should read -- 400°C --, "250° C" should read -- 250°C --, and "350° C" should read -- 350°C -- as shown on page 27, lines 15-16 of the specification filed on April 27, 1999.

Column 17,
Line 32, "$H_2SiH_4$" should read -- $H_2/SiH_4$ -- as shown on page 37, line 25 of the specification filed on April 27, 1999.
Line 35, "150° C" should read -- 150°C -- and "350° C" should read -- 350°C -- as shown on page 37, line 28 of the specification filed April 27, 1999.

Column 19,
Lines 63-64, "200° C" should read -- 200°C --, "400° C" should read -- 400°C --, "250° C" should read -- 250°C -- and "350° C" should read -- 350°C -- as shown on page 43, lines 6-7 of the specification filed April 27, 1999.

UNITED STATES PATENT AND TRADEMARK OFFICE

CERTIFICATE OF CORRECTION

PATENT NO. : 6,274,881 B1

DATED : August 14, 2001

INVENTOR(S) : Akiyama et al.

It is certified that error appears in the above-identified patent and that said Letters Patent is hereby corrected as shown below:

<u>Column 21,</u>
Line 11, "$1x10^{\sim}cm^{-2}$" should read -- $1 \times 10^{-18}cm^{-3}$ --.

Signed and Sealed this

Twenty-sixth Day of November, 2002

*Attest:*

JAMES E. ROGAN

*Attesting Officer*

*Director of the United States Patent and Trademark Office*